US011789065B1

(12) United States Patent
Allwine et al.

(10) Patent No.: US 11,789,065 B1
(45) Date of Patent: Oct. 17, 2023

(54) TEMPERATURE COMPENSATED CURRENT SOURCE FOR CRYOGENIC ELECTRONIC TESTING

(71) Applicants: Scott F. Allwine, Leesburg, VA (US); Sunny Bagga, Corona, CA (US); Brian J. Cadwell, Pasadena, MD (US); Shaun Mark Goodwin, East New Market, MD (US)

(72) Inventors: Scott F. Allwine, Leesburg, VA (US); Sunny Bagga, Corona, CA (US); Brian J. Cadwell, Pasadena, MD (US); Shaun Mark Goodwin, East New Market, MD (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 0 days.

(21) Appl. No.: 17/830,697

(22) Filed: Jun. 2, 2022

(51) Int. Cl.
*G01K 3/00* (2006.01)
*G01R 19/165* (2006.01)
*G01R 31/28* (2006.01)

(52) U.S. Cl.
CPC ......... *G01R 31/2877* (2013.01); *G01K 3/005* (2013.01); *G01R 19/1659* (2013.01)

(58) Field of Classification Search
CPC . G01R 31/2877; G01R 19/1659; G01K 3/005
See application file for complete search history.

(56) References Cited

U.S. PATENT DOCUMENTS

| 2003/0080807 A1* | 5/2003 | Dasgupta | G05F 3/30 |
| | | | 327/543 |
| 2015/0098163 A1* | 4/2015 | Ferrara | H03K 17/145 |
| | | | 327/309 |

\* cited by examiner

*Primary Examiner* — Jermele M Hollington
*Assistant Examiner* — Zannatul Ferdous
(74) *Attorney, Agent, or Firm* — Tarolli, Sundheim, Covell & Tummino LLP

(57) ABSTRACT

This disclosure relates to systems and methods for current source temperature compensation for use during cryogenic electronic testing. A temperature compensation circuit can provide a temperature compensation signal to a current source circuit configured to provide an electrical current for testing a cryogenic device under test to compensate for temperature effects on the current source circuit based on a time constant adjustment signal. The time constant adjustment signal can adjust a time constant of the temperature compensation circuit to delay by a given amount of time that the temperature compensation circuit compensates for the temperature effects on the current source circuit. A controller can be configured to execute a temperature compensation method to provide the time constant adjustment signal based on at least one temperature signal characterizing a temperature of an environment that includes the current source circuit or a temperature of the current source circuit.

20 Claims, 6 Drawing Sheets

TEMPERATURE COMPENSATED CURRENT SOURCE FOR CRYOGENIC ELECTRONIC TESTING

GOVERNMENT INTEREST

The invention was made under Government Contract. Therefore, the US Government has rights to the invention as specified in that contract.

TECHNICAL FIELD

This disclosure relates to a temperature compensated current source and more specifically to current source drift compensation in cryogenic electronic testing.

BACKGROUND

A current source is an electronic circuit or device that delivers or absorbs an electrical current that is independent of a voltage across it. Current sources are affected by environmental parameters, such as temperature. Temperature effects on the current source beyond or outside normal temperature conditions can impact a performance of the current source by causing current drift.

Cryogenic electronics refers to an operation of electronic devices, circuits, and systems at cryogenic temperatures. Cryogenic electronics (also referred to as low-temperature electronics, or cold electronics) can be based on semiconductive devices, superconductive devices, or a combination of the two.

SUMMARY

In an example, a system can include a temperature compensation circuit that can be configured to provide a temperature compensation signal to a current source circuit to compensate for temperature effects on the current source circuit based on a time constant adjustment signal. The system can include a controller that can be configured to receive a temperature signal characterizing a temperature of an environment that includes the current source circuit or a temperature of the current source circuit, compare the temperature to a temperature threshold, identify a thermal saturation time for the current source circuit in response to the temperature being greater than or equal to the temperature threshold, generate a time constant adjustment signal responsive to identifying the thermal saturation time, and provide the time constant adjustment signal to the temperature compensation circuit to adjust a time constant of the temperature compensation circuit to delay by a given amount of time that the temperature compensation circuit compensates for the temperature effects on the current source circuit.

In another example, a controller can include at least one processor and memory comprising machine readable instructions representative of a temperature compensation method. The at least one processor can be configured to access the memory and execute the machine readable instructions to compare a temperature of an environment that includes a current source circuit or a temperature of the current source circuit to a temperature threshold, identify a thermal saturation time for the current source circuit in response to determining that the temperature is greater than or equal to the temperature threshold, generate a time constant adjustment signal responsive to identifying the thermal saturation time, and provide the time constant adjustment signal to a temperature compensation circuit to adjust a time constant of the temperature compensation circuit to delay by a given amount of time that the temperature compensation circuit compensates for temperature effects on the current source circuit.

In a further example, a method can include receiving a temperature signal characterizing a temperature of an environment that includes the current source circuit or a temperature of the current source circuit, comparing the temperature to a temperature threshold, identifying a thermal saturation time for the current source circuit from a temperature saturation table in response to the temperature being greater than or equal to the temperature threshold, comparing the thermal saturation time to a time constant table characterizing thermal saturation times for different resistances to identify a respective resistance for an adjustable resistor of a resistor-capacitor (RC) network of a temperature compensation circuit, generating a time constant adjustment signal based on the identified resistance, and providing the time constant adjustment signal to the temperature compensation circuit to adjust a resistance of the adjustable resistor to adjust a time constant of the RC network of the temperature compensation circuit to delay by a given amount of time that the temperature compensation circuit compensates for temperature effects on a current source circuit.

DETAILED DESCRIPTION

Figure 1:
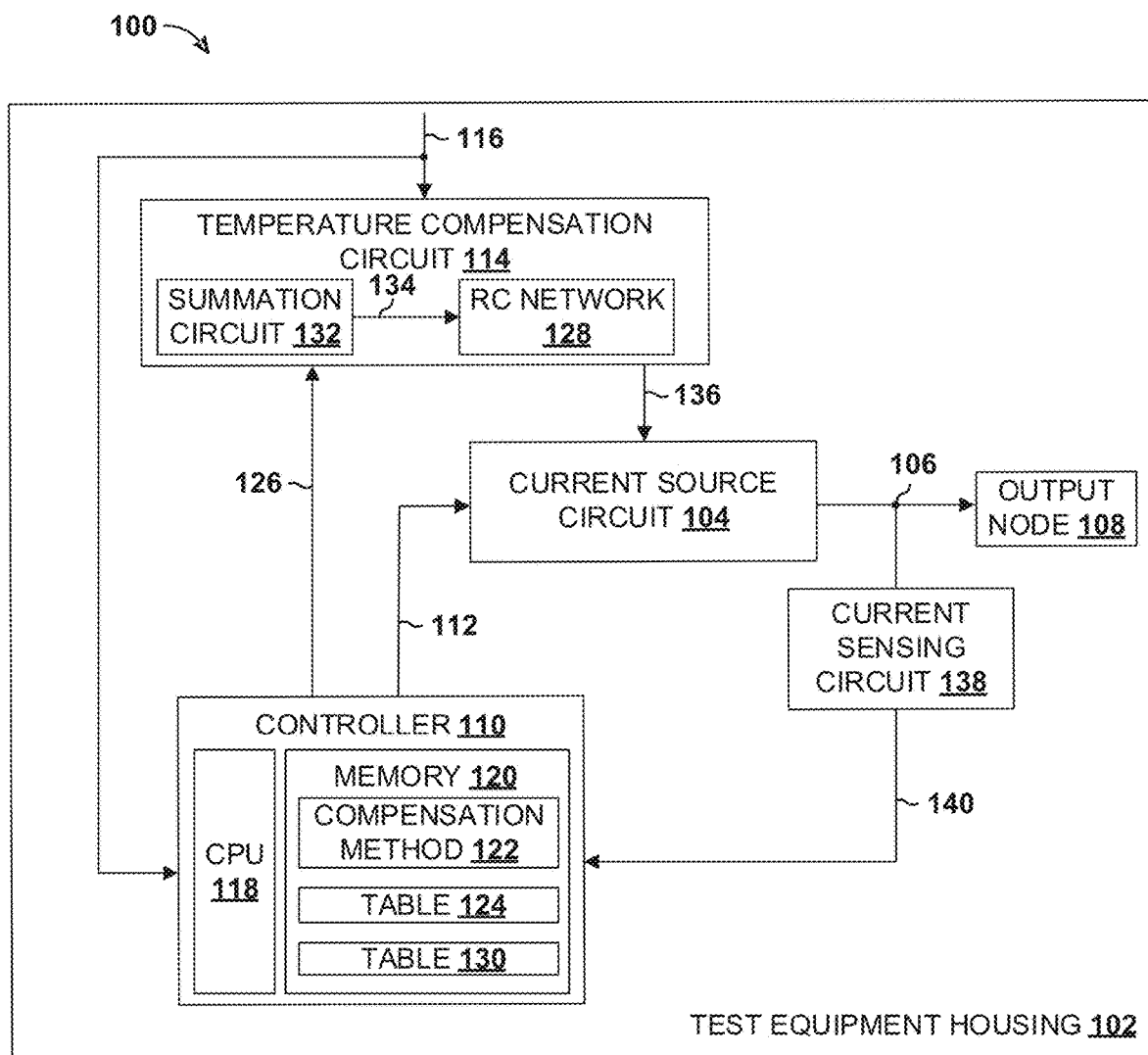
FIG. 1 is an example of a system with a temperature compensated current source.

During testing of cryogenic electronics, for example, a cryogenic device, referred to as a cryogenic device under test (DUT), can be placed in a container, cooler, fridge, or chamber that is configured to support a cryogenic environment. Cryogenic electronic testing uses high-precision test currents to accurately verify a performance and/or characteristics of a cryogenic DUT. A "high-precision" test current is a current signal in a micro-amps or a lower operating range, such as a nano-amperes range. Test signal generation circuits are susceptible to changes in temperature. For example, as testing electronics heat up and increase in operating temperature, semiconductors devices that include current sources increase in temperature as thermal energy from ambient air, nearby devices, and/or circuits is absorbed by the current sources. The thermal energy absorbed by a current source over time increases the operating temperature of the current source. Because low test currents are used during cryogenic electronic testing, an increase current source operating temperature causes the test currents drift.

For accurate cryogenic DUT testing the test current has to be as close as possible to an ideal or desired test current. Existing temperature compensation techniques employ a temperature sensor to measure ambient temperature and use the temperature sensor measurements to null temperature effects on the electrical current. Semiconductor current sources do not instantaneously increase in temperature in response to an external thermal energy source (e.g., ambient air, nearby devices and/or circuits such on a same die), and thus temperature changes at such devices are not instantaneous. That is it takes time for the semiconductor current source to absorb the emitted thermal energy from the external thermal energy source. Thus, existing approaches compensate for temperature effects before such conditions actually cause the test current to drift beyond an acceptable current drift threshold or outside an acceptable current drift range.

Examples are described herein for compensating for temperature effects on current sources used in high-precision applications. While examples are described herein for mitigating temperature effects on current sources used in cryogenic electronic testing applications, the examples herein can equally be used in other types of electronic applications that use low power and high-precision electrical currents.

In some examples, a controller can be configured to receive a temperature signal characterizing a temperature of an environment that includes a current source circuit and/or a temperature of the current source circuit. In some examples, the controller can be configured to receive a first temperature signal characterizing the temperature of the environment and a second temperature signal characterizing the temperature of the current source circuit. The environment can be representative of test equipment housing that houses test signal generation circuits, in some instances on different modules or on a similar module. A module that includes the current source circuit may include one or more various printed circuit boards (PCBs) with test signal generation circuits or devices that may emit thermal energy that can be absorbed by the current source circuit.

The controller can be configured to compare each temperature to a temperature threshold. The controller can identify a thermal saturation time for the temperature based on a temperature saturation table in response to the temperature being greater than or equal to the temperature threshold. The controller can compare the thermal saturation time to a time constant table characterizing thermal saturation times for different resistances to identify a respective resistance for an adjustable resistor of an RC network of a temperature compensation circuit. In some instances, the temperature saturation table and the time constant table may be employed as a single table. The controller can be configured to generate a time constant adjustment signal based on the identified resistance. A resistance of the adjustable resistor can be set responsive to the time constant adjustment signal to adjust a resistance of the adjustable resistor to the respective resistance thereby adjusting a time constant of the temperature compensation circuit.

The temperature compensation circuit can be configured to provide a temperature compensation signal to a current source circuit to compensate for temperature effects on the current source circuit based on the time constant adjustment signal. The time constant adjustment signal adjusts the time constant of the RC network to delay by a given amount of time that the temperature compensation circuit compensates for temperature effects on the current source circuit. Thus, the temperature compensation circuit does not instantaneously provide the temperature compensation signal (as in existing approaches) but rather delays for a moment in time corresponding to the given amount of time to provide the signal. This allows for more precise test currents to be provided by the current source circuit (in contrast to existing approaches). This is because current source circuits drift at a later time (rather than instantaneously) as the emitted thermal energy needs to be absorbed by the current source circuit to a level that causes temperature current drift (also can be referred to in some instances as thermal current drift). By providing the temperature compensation signal at a later time temperature caused current drift is minimized or eliminated at around a time that the test current begins to drift rather than instantaneously as in existing approaches. Moreover, by using an RC network with an adjustable resistor, the systems and methods herein allow for dynamic current drift adjustment as the current source circuit varies or changes in temperature over its operating life. The current source circuit can be configured to provide a temperature compensated test current based at least on the temperature compensation signal. The temperature compensated test current can be provided to a cryogenic DUT to verify a performance or characteristics of the cryogenic DUT. As an example, the cryogenic DUT can be a JJ device, however, in other examples, the cryogenic DUT can be another type of cryogenic device.

FIG. 1 is an example of a system 100 with a temperature compensated current source. In the example of FIG. 1, the system 100 can be a cryogenic electronic testing system that includes test generation circuits and/or devices for generating cryogenic test signals. For clarity and brevity purposes not all of the testing electronic or elements of the system (e.g., modules, connections, etc.) are shown in the example of FIG. 1. The system 100 can include test equipment housing 102 in which a current source circuit 104 can be located and configured to provide a test current 106 to an output node 108. In some examples, the test equipment house 102 can be representative of a test equipment rack or cabinet. The test current 106 can be representative a differential test current. The current source circuit 104 can be implemented on an integrated circuit (IC), which can reside on a PCB. A cryogenic DUT can be coupled to the output node 108 to receive the test current during cryogenic DUT testing. A controller 110 of the system 100 can be configured to control the current source circuit 104 and thus can control an amount of the test current provided to the output node 108.

For example, the controller 110 can be configured to provide a reference signal 112. The current source circuit 104 can be configured to provide the test current 106 at a set or specified level (e.g., amplitude) to the output node 108 based on the reference signal 112. The system 100 includes a temperature compensation circuit 114. The temperature compensation circuit 114 can be configured to receive temperature signals 116. For example, the temperature signals 116 can include a first temperature signal that can be generated by a first temperature sensor. The first temperature sensor can measure a temperature of ambient air within the test equipment housing 102 and provide a voltage signal (corresponding to the first temperature signal) representative of the temperature of the ambient air.

In some examples, the temperature signals 116 can include a second temperature signal that can be generated by a second temperature sensor. The second temperature sensor can measure a temperature of the current source circuit 104. For example, if the current source circuit 104 is implemented on a semiconductor device (e.g., the IC), the second temperature sensor can measure the temperature of the semiconductor device. Thus, as the semiconductor device increase in thermal energy, the second temperature sensor can provide a measure of the temperature of the semiconductor device and thus the current source circuit 104.

As shown in FIG. 1, the temperature signals 116 can be provided to the controller 110. The controller 110 can include a processor 118 (e.g., a central processing unit (CPU)) and memory 120. The memory 120 can represent a non-transitory machine-readable memory (or other medium) that can be accessed by the processor 118 to execute a temperature compensation method 122. For example, the processor 118 can be configured to compare each of the temperature signals 116 to a temperature threshold. If any of the temperature signals 116 is equal to or greater than the temperature threshold, the processor 118 can be configured to compare a respective temperature represented by a corresponding temperature signal that is equal to or greater than the temperature threshold to a temperature saturation table 124.

The temperature saturation table 124 can identify thermal saturation times for different respective temperatures. The term "thermal saturation time" can refer to an amount of time that elapses for a current source circuit to increase in temperature from a first temperature to a second temperature corresponding to the respective temperature. For example, referred to herein, as a "given example," the respective temperature signal is representative of an ambient air temperature, and the ambient air temperature increases from a first ambient air temperature to a second ambient air temperature. In the given example, an amount of time that is elapsed to increase the current source circuit 104 from a first operating temperature to a second operating temperature (corresponding to the second ambient air temperature) can be referred to as a thermal saturation time.

By way of further example, the processor 118 can be configured to identify a given thermal saturation time for the respective temperature based on the temperature saturation table 124. In the given example, the given thermal saturation time can be representative of five (5) minutes and can indicate that five (5) minutes has to elapse for the current source circuit 104 to increase from the first operating temperature (that is lower than the respective temperature) to the second operating temperature corresponding to the second ambient air temperature.

The processor 118 can be configured to cause the controller 110 to generate a time constant adjustment signal 126 to adjust a time constant of an RC network 128 of the temperature compensation circuit 114 based on the given thermal saturation time identified from the temperature saturation table 124. For example, the processor 118 can be configured to compare the given thermal saturation time to a time constant table 130. While the example of FIG. 1 shows the time constant table 130 separate from the temperature saturation table 124, in some examples, the temperature saturation table 124 can include the time constant table 130. Thus, in some instances, the tables 124 and 130 can be implemented as a single data table. The time constant table 130 can identify thermal saturation times for different resistances for an adjustable or variable resistor of the RC network 128. Because a time constant of the RC network 128 is based on a resistance of the resistor, a selected or identified resistance from the time constant table 130 for the resistor can adjust the time constant of the RC network. Thus, the time constant adjustment signal 126 can set a resistance of the adjustable resistor of the RC network 128 to control or adjust the time constant of the RC network 128.

As shown in FIG. 1, the temperature compensation circuit 114 includes a summation circuit 132. The summation circuit 132 can be configured to sum the temperature signals 116 to provide a summed temperature signal 134. The summed temperature signal 134 can be provided to the RC network 128. The time constant of the RC network 128 can be set (and thus controlled) based on the time constant adjustment signal 126 by adjusting the resistance of the resistor of the RC network 128. The time constant adjustment signal 126 can control a rate at which charge is stored at a capacitor of the RC network 128 based on the summed temperature signal 134. An amount of time that it takes to charge the capacitor of the RC network 128 can correspond to the given thermal saturation time, and thus can be set or defined by the resistor of the RC network 128. Once the capacitor of the RC network is charged (and thus acts as an open-circuit), a current (e.g., the summed temperature signal 134) can be provided by the temperature compensation circuit 114 as a temperature compensation signal 136 to the current source circuit 104.

The current source circuit 104 can employ the temperature compensation signal 136 to compensate for temperature effects on the test current 106, and thus minimize drift to provide a temperature compensated test current. In some examples, the system 100 includes a current sensing circuit 138. The current sensing circuit 138 can sense (e.g., sample) the test current 106 and provide a sensed test current 140 to the controller 110. The processor 118 can be configured to determine a drift rate of the test current 106 over time based on the sensed test current 140. The drift rate can characterize an amount that the test current 106 varies with respect to temperature relative to a target or desired test current for the current source circuit 104. Once the processor 118 has identified the drift rate for the test current 106, the processor 118 can be configured to compare the drift rate to a drift rate threshold or range. If the drift rate of the test current 106 is equal to or greater than the drift rate threshold or is outside the drift rate range, the processor 118 can be configured to compare each of the temperature signals 116 to the temperature threshold to identify the respective temperature for comparison to the temperature saturation table 124 to identify the given thermal saturation time for the respective temperature. Thus, the processor 118 can adjust the resistance of the resistor of the RC network 128 to compensate for an amount that the test current is drifting over time.

In some examples, the processor 118 can be configured to cause the controller 110 to enter a standby mode or sleep mode for a given amount of time in response to determining that the drift rate of the test current 106 is less than the drift rate threshold or is within the drift rate range. Because the controller 110 enters the sleep mode and is not continuously operating (e.g., processing signals, data, etc.) this reduces an electrical noise produced by the controller 110, which can obscure the test current 106. Because the test current 106 is in a low current range (e.g., in a micro or nano-amperes range) and is used for testing cryogenic electronics, reducing the electrical noise from the controller 110, such as during testing, improves a precision of the test current 106, thereby improving an accuracy of cryogenic DUT testing.

The processor 118 can be configured to periodically wake-up and implement the temperature compensation method 122 to determine whether the test current 106 has drifted outside normal or allowed operating parameters, and adjust the temperature compensation signal 136 provided by the temperature compensation circuit 114 (e.g., by adjusting the time constant of the RC network 128 via the resistance of the resistor therein) to compensate for current drift in the test current 106 caused by an increase in temperature of the current source circuit 104. Accordingly, the current source circuit 104 can be compensated for temperature effects so that that current source circuit 104 can provide precise test currents (e.g., within 0.01% of the target test current) for testing cryogenic DUTs.

In some instances, the processor 118 can determine that the time constant of the RC network 128 should be decreased from a given time constant (e.g., set in response to an increase in ambient and/or local temperature) to another time constant. For example, if the temperature of the environment or the temperature of the current source circuit 104 decreases, the processor 118 can adjust the time constant of the RC network 128 in a same or similar manner as described herein. Thus, the time constant of the RC network 128 can be dynamically adjusted based on changes in temperature conditions in the test equipment housing 102 or the current source circuit 104.

While the example of FIG. 1 illustrates the temperature signals 116 being provided from respective temperature sensors to the controller 110, in other examples, the temperature compensation circuit 114 can provide the temperature signals 116 to the controller 110. For example, the temperature compensation circuit 114 can employ a second summation circuit (similar to the summation circuit 132) that can be configured to provide a second summation temperature signal to the controller 110. The controller 110 can be configured to compare the second summation temperature signal to the temperature threshold to identify the respective temperature for comparison to the temperature saturation table 124 to identify the given thermal saturation time for the respective temperature. The second summation temperature signal can be representative of a summed temperature of the temperature of an environment that includes the current source circuit and the temperature of the current source circuit. Thus, in some examples, the controller 110 can implement the temperature compensation method 122 based on a summed temperature representative of both the temperature of the environment and the current source circuit. In some instances, the controller 110 can average the summed temperature and use the average temperature for comparison to the temperature threshold to identify the respective temperature for comparison to the temperature saturation table 124 to identify the given thermal saturation time for the respective temperature.

Figure 2:
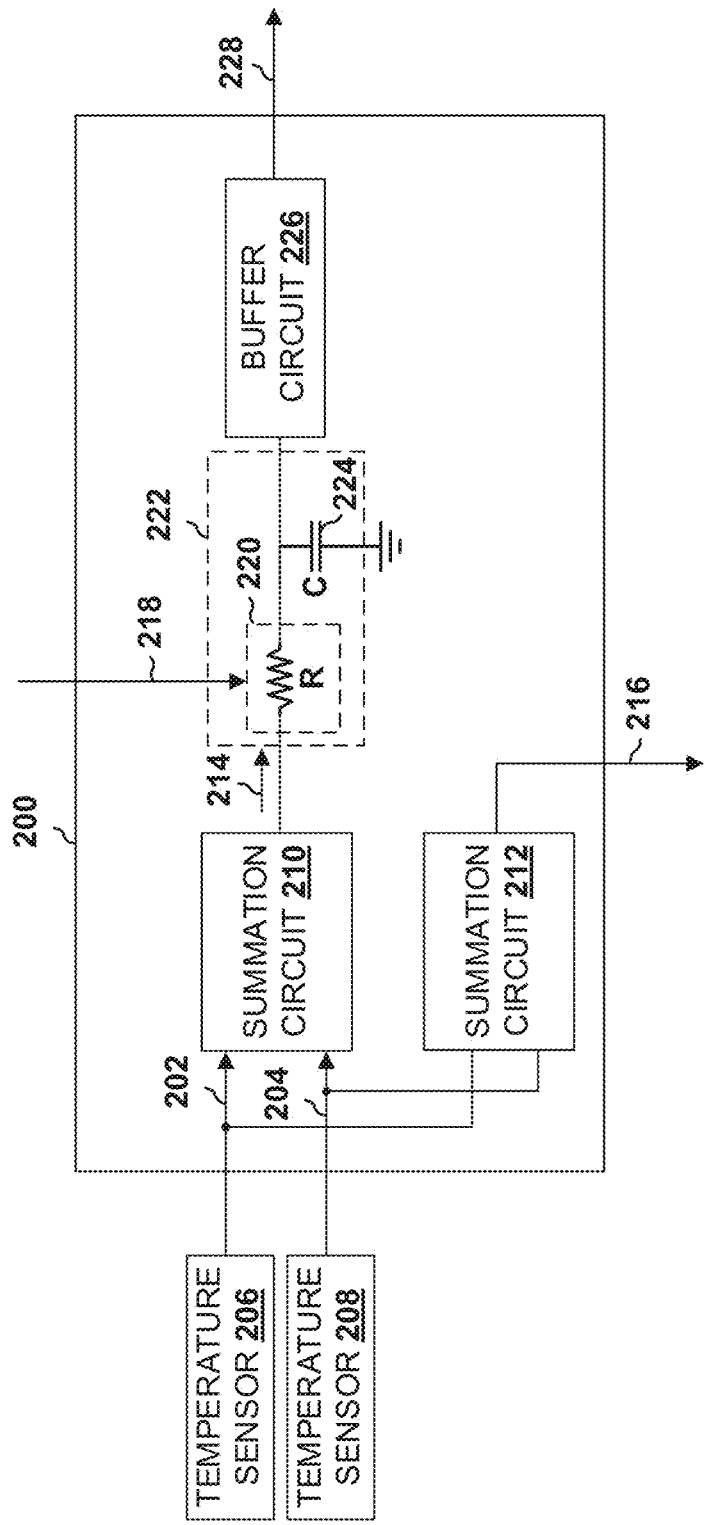
FIG. 2 is an example of a temperature compensation circuit.

FIG. 2 is an example of a temperature compensation circuit 200. The temperature compensation circuit 200 can be the temperature compensation circuit 114, as shown in FIG. 1. Thus, in some examples, reference can be made to FIG. 1 in the example of FIG. 2. The temperature compensation circuit 200 can be configured to receive first and second temperature signals 202 and 204. The first and second temperature signals 202 and 204 can form or be part of the temperature signals 116, as shown in FIG. 1. The first temperature signal 202 can be provided by a first temperature sensor 206. As an example, the first temperature sensor 206 can be a negative temperature coefficient (NTC) thermistor. The first temperature sensor 206 can measure a temperature of ambient air within test equipment housing (e.g., the test equipment housing 102, as shown in FIG. 1) and provide a voltage signal (corresponding to the first temperature signal 202) representative of the temperature of the ambient air. The second temperature signal 204 can be provided by a second temperature sensor 208. In an example, the second temperature sensor 208 can be an NTC thermistor. The second temperature sensor 208 can measure a temperature of a current source circuit (e.g., the current source circuit 104, as shown in FIG. 1). While the example of FIG. 2 illustrates the temperature compensation circuit 200 receiving two temperature signals in other examples the temperature compensation circuit 200 can receive other temperature signals from other temperature sensors within the test equipment housing.

Continuing with the example of FIG. 2, the temperature compensation circuit 200 includes a first summation circuit 210 and a second summation circuit 212. For example, each summation circuit can include a weighting circuit and a summing amplifier. As an example, the weighting circuit can be implemented as a voltage divider. Each temperature sensor signal received at each of the first and second summation circuits 210 and 212 can be weighted by a corresponding weighting circuit and provided to a summing amplifier. Therefore each temperature sensor signal is 'weighted' at an input to the summing amplifier. Each weighting circuit can be used to weigh each temperature sensor signal (e.g., by a given weight amount) by reducing a voltage/degree. A respective summing amplifier can provide a corresponding summed temperature signal, which can be representative of a weighted temperature signal that is based on the first and second temperature sensor signals 202 and 204. The first summation circuit 210 can correspond to the summation circuit 132, as shown in FIG. 1. The first summation circuit 210 can sum the first and second temperature signals to provide a first summed temperature signal 214. The first summed temperature signal 214 can correspond to the summed temperature signal 134, as shown in FIG. 1.

The second summation circuit 212 can be configured to provide a second summed temperature signal 216. The second summed temperature signal 216 can be provided to a controller, such as the controller 110, as shown in FIG. 1. In some examples, the second summation circuit 212 can be omitted and the first and second temperature signals 202 and 204 can be provided to the controller, such as described herein with respect to FIG. 1. The controller can implement a temperature compensation method (e.g., the temperature compensation method 122, as shown in FIG. 1) to provide for temperature compensation of the current source circuit. For example, as described herein, the controller can be configured to provide a time constant adjustment signal 218 to set a resistance (labeled as "R") of an adjustable resistor 220 of an RC network 222 of the temperature compensation circuit 200. The RC network 222 as shown in FIG. 2 further includes a capacitor 224 with a capacitance (labeled as "C").

The time constant adjustment signal 218 can control a rate at which charge is stored at the capacitor 224 of the RC network 222 based on the first summed temperature signal 214. The time constant adjustment signal 218 can be used to adjust a time constant of the RC network 222 to delay by a given amount of time that the temperature compensation circuit 200 compensates for temperature effects on the current source circuit. An amount of time that it takes to charge the capacitor 224 of the RC network 222 can correspond to a given thermal saturation time, and thus can be set or adjusted by the adjustable resistor 220 of the RC network 222 based on temperature conditions such as described herein. Once the capacitor 224 of the RC network 222 is charged (and thus acts as an open-circuit), a current (e.g., the first summed temperature signal 214) can be provided to a buffer circuit 226 (e.g., a buffer amplifier), which can provide a temperature compensation signal 228. The temperature compensation signal 228 can correspond to the temperature compensation signal 136, as shown in FIG. 1. As described herein, the current source circuit can be configured to generate a test current in a low current range (e.g., in a micro or nano-amperes range) based on the temperature compensation signal 228 to provide a temperature compensated test current (e.g., a high-precision test current) that can be used for accurate and precise testing of cryogenic DUTs (e.g., JJ devices or other types of quantum devices).

Figure 3:
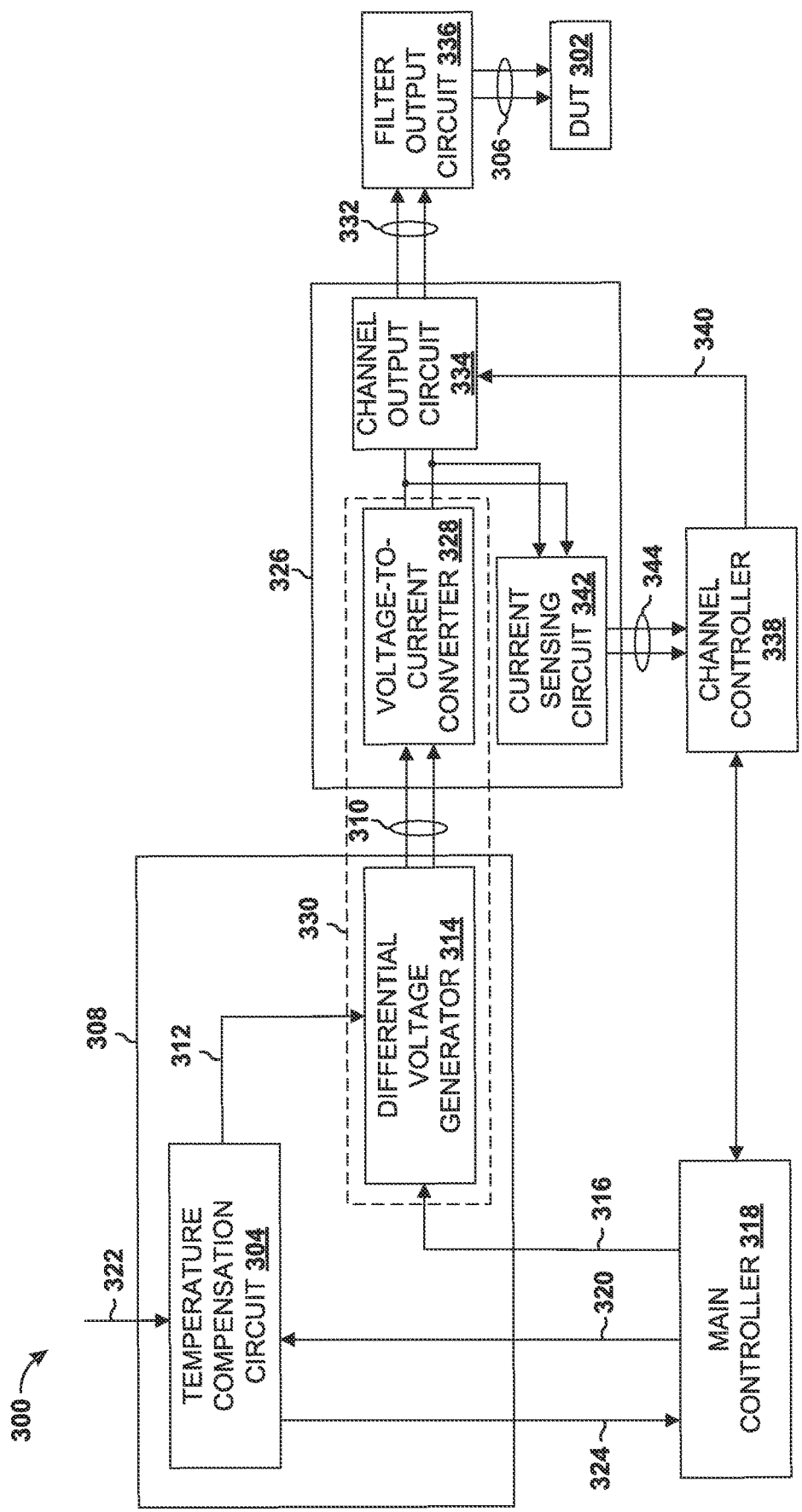
FIG. 3 is an example of a cryogenic electronic testing system.

FIG. 3 is an example of a cryogenic electronic testing system 300 that can be used for testing a performance and/or characteristics of a cryogenic DUT 302. The testing system 300 can be implemented with a temperature compensation circuit 304 that can be configured to compensate for temperature effects on a differential test current 306 provided to the cryogenic DUT 302 during cryogenic DUT testing. The temperature compensation circuit 304 can be used to mitigate temperature drift effects on the differential test current 306 and provide the cryogenic DUT 302 with stable testing currents. The temperature compensation circuit 304 is the temperature compensation circuit 114, as shown in FIG. 1, or the temperature compensation circuit 200, as shown in FIG. 2. Thus, in some examples, reference can be made to FIGS. 1-2 in the example of FIG. 3.

The system includes a voltage source circuit 308. The voltage source circuit 308 can be configured to provide a differential temperature compensated voltage 310, which can be used to provide a temperature compensated differential test current. In the example of FIG. 3, the voltage source circuit 308 includes the temperature compensation circuit 304, however, in other examples, the temperature compensation circuit 304 may be located outside the voltage source circuit 308. For example, the temperature compensation circuit 304 can be implemented on a separate die and can be coupled to another die on which the voltage source circuit 308 can be implemented. The temperature compensation circuit 304 can provide a temperature compensation signal 312 to a differential voltage generator 314 in a same or similar manner as described with respect to FIGS. 1-2.

The differential voltage generator 314 can be configured to receive the temperature compensation signal 312 and a reference signal 316 that can provide a reference voltage. In some examples, the reference signal 316 can correspond to the reference signal 112, as shown in FIG. 1. The differential voltage generator 314 can be configured to output the differential temperature compensated voltage 310 based on the reference signal 316 and the temperature compensation signal 312. In some examples, the reference signal 316 is a digital signal and the differential voltage generator 314 includes a digital to analog (DAC) converter. By way of example, the DAC converter can be a 20-bit DAC converter. In other examples, a DAC converter with a different resolution type can be used.

The system can include a main controller 318 that can be configured to provide the reference signal 316. The main controller 318 can correspond to the controller 110, as shown in FIG. 1. Thus, the main controller 318 can be configured to implement a temperature compensation method (e.g., the temperature compensation method 122, as shown in FIG. 1) to provide a time constant adjustment signal 320 for adjusting a time constant of the temperature compensation circuit 304. The main controller 318 can be configured to provide the time constant adjustment signal 320 to the temperature compensation circuit 304 to adjust a time constant of the temperature compensation circuit 304 to delay by a given amount of time that the temperature compensation circuit 304 compensates for the temperature effects on the differential test current 306. The temperature compensation circuit 304 can be configured to provide the temperature compensation signal 312 based on the time constant adjustment signal 320 and temperature signals 322. The temperature signals 322 can correspond to the temperature signals 116, as shown in FIG. 1. In some examples, the temperature signals 322 can include the first and second temperature signals 202 and 204, as shown in FIG. 2. In some instances, the temperature signals 322 can be summed at the temperature compensation circuit 304 and provided as a summed temperature signal 324 to the main controller 318. The summed temperature signal 324 can correspond to the second summed temperature signal 216, as shown in FIG. 2. In some instances, the temperature signals 322 can be provided to the main controller 318, and in these examples, the summed temperature signal 324 can be omitted.

The system 300 can further include a current output circuit 326. The voltage source circuit 308 and the current output circuit 326 can be located in a similar test equipment housing, such as the test equipment housing 102, as shown in FIG. 1. The current output circuit 326 can include a voltage-to-current (VI) converter 328. In some examples, the differential voltage generator 314 and the VI converter 328 can form a current source circuit 330, such as the current source circuit 104, as shown in FIG. 1. The VI converter 328 can be configured to provide an intermediate differential test current 332 based on the differential temperature compensated voltage 310. The current output circuit 326 further includes a channel output circuit 334 that can be configured to provide the intermediate differential test current 332 to a filter output circuit 336, which can provide the differential test current 306 as a temperature compensated differential test current to the DUT 302.

In the example of FIG. 3, a single channel is shown for providing a differential test current for testing a single cryogenic DUT. A channel as used herein can refer to a test current pathway from a respective voltage source circuit to a corresponding cryogenic DUT. Thus, while the example of FIG. 3 is described with respect to a single channel, in other examples, any number of channels (e.g., twelve (12) channels) can be used for testing a corresponding number of cryogenic DUTs. The cryogenic DUTs, and thus the DUT 302 can be placed in a container, cooler, fridge, or chamber that is configured to support a cryogenic environment. Each channel can be enabled or activated during cryogenic testing of the corresponding cryogenic DUT by a channel controller 338 to provide a respective differential electrical test current to the corresponding cryogenic DUT.

In the example of FIG. 3, the channel controller 338 can be configured to provide a channel enable signal 340 to the channel output circuit 334 to allow the intermediate differential test current 332 to be provided to the filter output circuit 336. The filter output circuit 336 can include one or more filters to remove noise from the intermediate differential test current 332 to provide the differential test current 306. For example, the filter output circuit 336 can include a differential filter, a common mode filter, or a combination thereof. In some examples, the filter output circuit 336 includes series termination resistors.

The current output circuit 326 further includes a current sensing circuit 342. The current sensing circuit 342 can correspond to the current sensing circuit 138, as shown in FIG. 1. The current sensing circuit 342 can be configured to measure (e.g., sample) the intermediate differential test current 332 received at the an input to the channel output circuit 334 and provide a sampled intermediate differential test current 344 to the channel controller 338. The channel controller 338 can communicate the sampled intermediate differential test current 344 to the main controller 318. As shown in FIG. 3, the main controller 318 and the channel controller 338 can be configured to communicate bi-directionally to exchange data, signals, etc. For example, the main controller 318 can be configured channel parameters of the channel controller 338 such as during an initialization or power-up phase of the system 300.

The main controller 318 can be configured to determine a drift rate of the sampled intermediate differential test current 344 and thus the differential test current 306 over time. The drift rate can characterize an amount that sampled intermediate differential test current 344 varies with respect to temperature relative to a target or desired test current. Once the main controller 318 determines the drift rate of the sampled intermediate differential test current 344, the main controller 318 can be configured to compare the drift rate to a drift rate threshold or range. If the drift rate of the sampled intermediate differential test current 344 is equal to or greater than the drift rate threshold or is outside the drift rate range, the main controller 318 can compare the summed temperature signal 324 to the temperature threshold to identify a respective temperature for comparison to a temperature saturation table (e.g., the temperature saturation table 124, as shown in FIG. 1) to identify a given thermal saturation time for the respective temperature. Thus, the main controller 318 can be configured to adjust a resistance of a resistor of an RC network (e.g., the RC network 222, as shown in FIG. 2) of the temperature compensation circuit 304 to compensate for temperature drift of the differential test current 306 to provide the temperature compensated differential test current. In some examples, the main controller 318 can be configured to enter the standby mode in a same or similar manner as described herein to reduce an electrical noise produced by the main controller 318.

Figure 4:
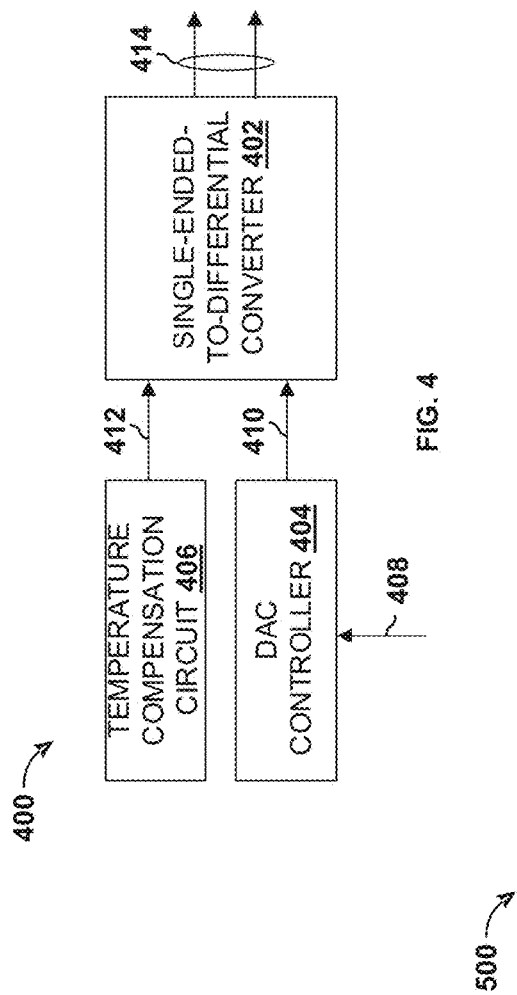
FIG. 4 is an example of a voltage source circuit.

FIG. 4 is an example of a voltage source circuit 400. The voltage source circuit 400 can be the voltage source circuit 308, as shown in FIG. 3. Thus, in some examples, reference can be made to FIG. 3 in the example of FIG. 4. The voltage source circuit 400 includes a single-ended-to-differential converter 402, a DAC controller 404, and a temperature compensation circuit 406. The single-ended-to-differential converter 402 and the DAC controller 404 can define or form the differential voltage generator 314, as shown in FIG. 3. Thus, the DAC controller 404 can be configured to receive a reference signal 408. The reference signal 408 can be representative of a digital signal and characterize a reference voltage to be provided by the DAC controller 404 to the single-ended-to-differential converter 402. The DAC controller 404 can be configured to provide an intermediate reference voltage 410 to the single-ended-to-differential converter 402 based on the reference signal 408. The temperature compensation circuit 406 can correspond to the temperature compensation circuit 304, as shown in FIG. 3, and can be configured to provide a temperature compensation signal 412. The temperature compensation signal 412 can be the temperature compensation signal 312, as shown in FIG. 3. The single-ended-to-differential converter 402 can be configured to output a differential temperature compensated voltage 414 based on a difference between the intermediate reference voltage 410 and the temperature compensation signal 412. The differential temperature compensated voltage 414 can correspond to the differential temperature compensated voltage 310, as shown in FIG. 3.

Figure 5:
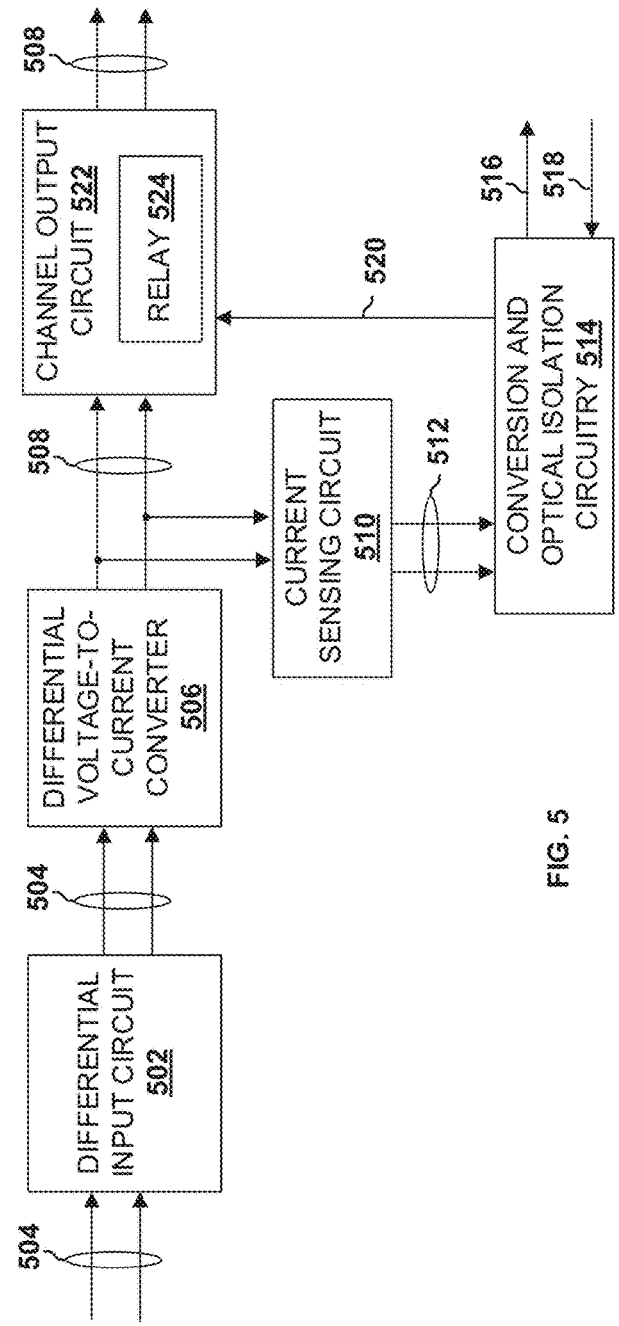
FIG. 5 is an example of a current output circuit.

FIG. 5 is an example of a current output circuit 500. The current output circuit 500 can be the current output circuit 326, as shown in FIG. 3. Thus, in some examples, reference can be made to FIGS. 3-4 in the example of FIG. 5. The current output circuit 500 includes a differential input circuit 502 that can be configured to receive a differential temperature compensated voltage 504. The differential temperature compensated voltage 504 can correspond to the differential temperature compensated voltage 310, as shown in FIG. 3, or the differential temperature compensated voltage 414, as shown in FIG. 4. The differential temperature compensated voltage 504 can be provided to a differential VI converter 506. The differential VI converter 506 can correspond to the VI converter 328, as shown in FIG. 3. The differential VI converter 506 can be configured to provide an intermediate differential test current 508 based on the differential temperature compensated voltage 504. The intermediate differential test current 508 can correspond to the intermediate differential test current 332, as shown in FIG. 3.

The current output circuit 500 can include a current sensing circuit 510. The current sensing circuit 510 can correspond to the current sensing circuit 342, as shown in FIG. 3. The current sensing circuit 510 can be configured to measure (e.g., sample) the intermediate differential test current 508 and provide a sampled intermediate differential test current 512. In some examples, the current output circuit 500 includes conversion and optical isolation circuitry 514. The conversion and optical isolation circuitry 514 can digitize the sampled intermediate differential test current 512 to provide a digitized representation. The conversion and optical isolation circuitry 514 can include an optoisolator transmitter. The optoisolator transmitter can be configured to convert the digitized representation into a first optical signal 516.

The first optical signal 516 can be transmitted over an optical medium to a channel controller, such as the channel controller 338, as shown in FIG. 3. In some examples, the channel controller 338 can include an optoisolator receiver which can recover the digitized representation for further processing as described herein. In some examples, the channel controller 338 can provide a second optical signal 518, which can be received by the conversion and optical isolation circuitry 514, as shown in FIG. 5. The second optical signal 518 can be representative of a channel enable signal 520. The conversion and optical isolation circuitry 514 can include an optoisolator receiver which can recover a digitized representation of the channel enable signal 520. The conversion and optical isolation circuitry 514 can generate the channel enable signal 520. The channel enable signal 520 can correspond to the channel enable signal 340, as shown in FIG. 3.

The channel enable signal 520 can be provided to a channel output circuit 522 of the current output circuit 500. The channel output circuit 522 can correspond to the channel output circuit 334, as shown in FIG. 3. The channel output circuit 522 can be enabled to provide the intermediate differential test current 508 downstream such as to the filter output circuit 336, as shown in FIG. 3. In some examples, the channel output circuit 522 includes a relay 524. As an example, the relay 524 can be a single pole double throw (SPDT) relay. In some examples, when the channel output circuit 522 is not receiving the channel enable signal 520 and thus the relay 524 is in a first state, the intermediate differential test current 508 is not provided downstream. In the first state, the relay 524 acts as an open circuit and no test current can flow downstream. In other examples, when the channel output circuit 522 is receiving the channel enable signal 520 and thus the relay is in a second state, the intermediate differential test current 508 is provided downstream.

Figure 6:
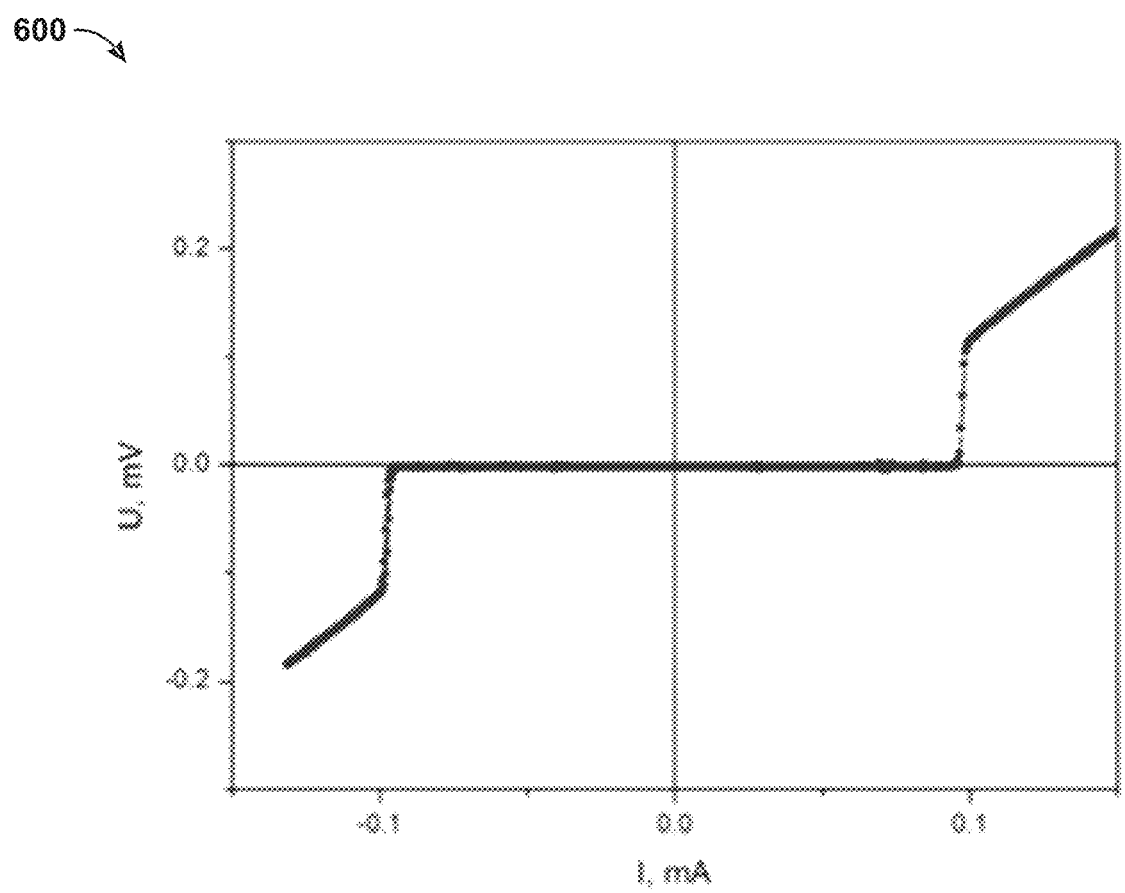
FIG. 6 is an example of a response of a Josephson Junction (JJ) device.

FIG. 6 is an example of a graphical representation of a current-voltage (IV) curve 600 of a cryogenic DUT, such as JJ device. Thus, in some examples, the DUT 302 can be representative of the JJ device. In order to test such quantum devices, there are certain criteria that must be met. The JJ device must be stimulated with a certain amount of current in order to see a certain voltage in the cryogenic environment. Below a certain constant current, there is no voltage that appears across terminals of the JJ device. However, when the current is increased to a certain point (e.g., about approximately 100 micro-amps (mA)) a voltage across the JJ device sharply jumps to about 100 micro-volts (mV). Finding this transition in JJ's plays an important role in determining proper operating points of the JJ device. Test currents for testing JJ devices in cryogenic testing are small (e.g., in contrast to testing non-quantum devices). This makes such test currents susceptible to noise and current source stability. The systems and methods described herein enable a very low noise and stable current to be supplied to the JJ device such that accurate understanding can be made regarding the functionality of the JJ device. Another important parameter of cryogenic DUT testing, is repeatability. In order for the JJ device to operate as expected a similar or same current has to be applied to the JJ device each time. The systems and methods described herein allow for accurate control of a stimulus current (e.g., the test current) by compensating for conductive and radiated thermal influence, IC drift, and initial accuracy errors, such that the test current is consistent across DUT tests.

Figure 7:
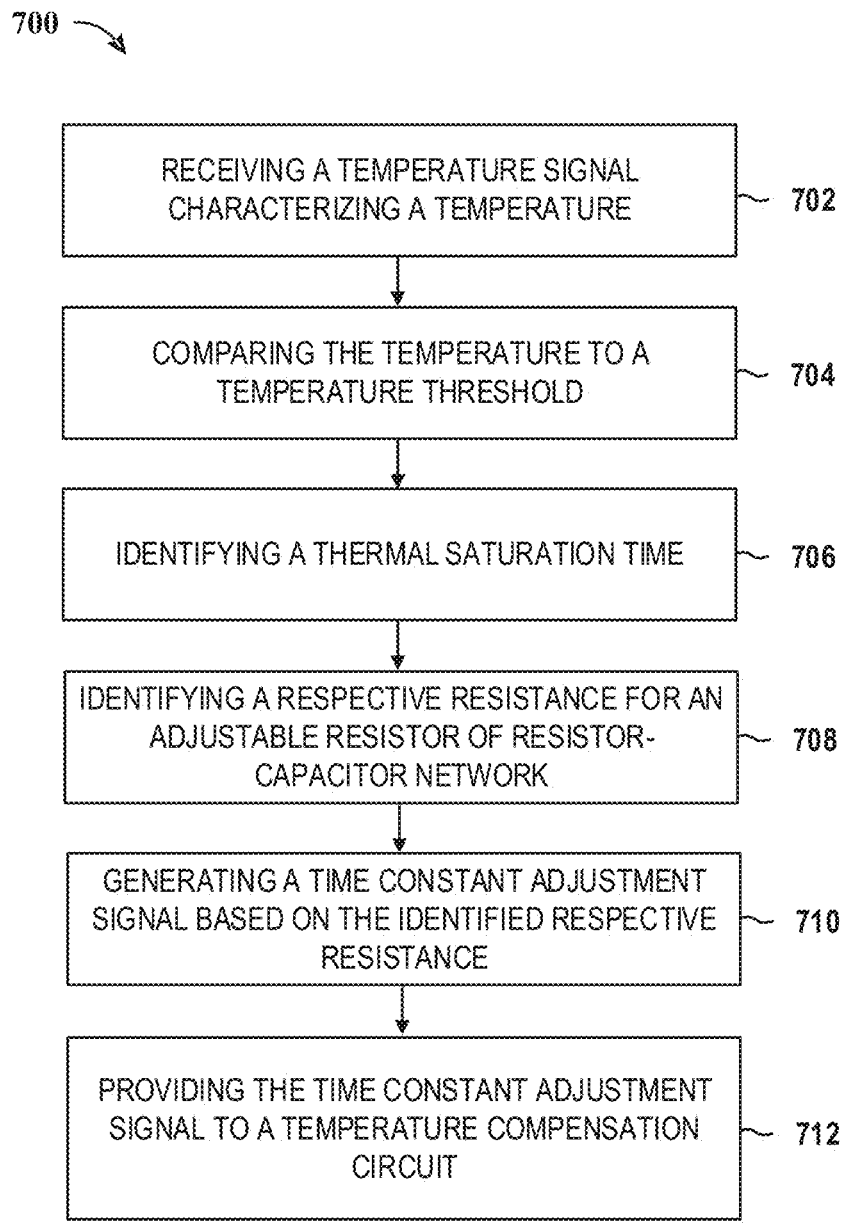
FIG. 7 is an example of a method for compensating for temperature effects on a current source.

In view of the foregoing structural and functional features described above, an example method will be better appreciated with reference to FIG. 7. While, for purposes of simplicity of explanation, the example method of FIG. 7 is shown and described as executing serially, it is to be understood and appreciated that the present examples are not limited by the illustrated order, as some actions could in other examples occur in different orders, multiple times and/or concurrently from that shown and described herein. Moreover, it is not necessary that all described actions be performed to implement a method.

FIG. 7 is an example of a method 700 for compensating for temperature effects on a current source circuit (e.g., the current source circuit 104, as shown in FIG. 1, or the current source circuit 330, as shown in FIG. 3). As described herein, in some examples, the current source circuit can be configured to provide a test current (e.g., the test current 106, as shown in FIG. 1 or the differential test current 306, as shown in FIG. 3) during cryogenic DUT testing. The method 700 can be implemented by the controller 110, as shown in FIG. 1 or the main controller 318, as shown in FIG. 3. Thus, in some examples, reference can be made to FIGS. 1-3 in the example of FIG. 7.

The method 700 can begin at 702 by receiving at least one temperature signal (e.g., at least one of the temperature signals 116, as shown in FIG. 1 or the temperature signals 322, as shown in FIG. 3) characterizing a temperature of an environment (e.g., the test equipment housing 102, as shown in FIG. 1) that includes the current source circuit or a temperature of the current source circuit. In some examples, the at least one temperature signal is the second summed temperature signal 216, as shown in FIG. 2, or the summed temperature signal 324, as shown in FIG. 3. At 704, comparing the temperature to a temperature threshold. At 706, identifying a thermal saturation time from a temperature saturation table (e.g., the temperature saturation table 124, as shown in FIG. 1) in response to the temperature being greater than or equal to the temperature threshold.

At 708, comparing the thermal saturation time to a time constant table (e.g., the time constant table 130, as shown in FIG. 1) characterizing thermal saturation times for different resistances to identify a respective resistance for an adjustable resistor of an RC network (e.g., the RC network 128, as shown in FIG. 1 or the RC network 222, as shown in FIG. 2) of a temperature compensation circuit (e.g., the temperature compensation circuit 114, as shown in FIG. 1). At 710, generating a time constant adjustment signal (e.g., the time constant adjustment signal 126, as shown in FIG. 1, the time constant adjustment signal 218, as shown in FIG. 2, or the time constant adjustment signal 320, as shown in FIG. 3) based on the identified respective resistance. At 712, providing the time constant adjustment signal to the temperature compensation circuit to adjust a resistance of the adjustable resistor to adjust a time constant of the RC network of the temperature compensation circuit to delay by a given amount of time that the temperature compensation circuit compensates for temperature effects on the current source circuit.

What has been described above are examples. It is, of course, not possible to describe every conceivable combination of components or methodologies, but one of ordinary skill in the art will recognize that many further combinations and permutations are possible. Accordingly, the disclosure is intended to embrace all such alterations, modifications, and variations that fall within the scope of this application, including the appended claims. As used herein, the term "includes" means includes but not limited to, the term "including" means including but not limited to. The term "based on" means based at least in part on. Additionally, where the disclosure or claims recite "a," "an," "a first," or "another" element, or the equivalent thereof, it should be interpreted to include one or more than one such element, neither requiring nor excluding two or more such elements.

What is claimed is:

1. A system comprising:
   a temperature compensation circuit configured to provide a temperature compensation signal to a current source circuit to compensate for temperature effects on the current source circuit based on a time constant adjustment signal;
   a controller configured to:
      receive a temperature signal characterizing a temperature of an environment that includes the current source circuit or a temperature of the current source circuit;
      compare the temperature to a temperature threshold;
      identify a thermal saturation time for the current source circuit in response to the temperature being greater than or equal to the temperature threshold;
      generate a time constant adjustment signal responsive to identifying the thermal saturation time; and
      provide the time constant adjustment signal to the temperature compensation circuit to adjust a time constant of the temperature compensation circuit to delay by a given amount of time that the temperature compensation circuit compensates for the temperature effects on the current source circuit.

2. The system of claim 1, wherein the temperature compensation circuit comprises an adjustable resistor connected in parallel with a capacitor to form a resistor-capacitor (RC) network, and the processor is configured to compare thermal saturation time to a time constant table characterizing thermal saturation times for different resistances to identify a respective resistance for the adjustable resistor.

3. The system of claim 2, wherein the processor is configured to generate the time constant adjustment signal based on the identified resistance, wherein a resistance of the adjustable resistor is set responsive to the time constant adjustment signal to adjust the resistance of the adjustable resistor to the respective resistance to adjust the time constant of the temperature compensation circuit.

4. The system of claim 3, wherein the processor is configured to compare the temperature to a temperature saturation table to identify the thermal saturation time in response to determining that the temperature is greater than or equal to the temperature threshold, wherein the temperature saturation table characterizes thermal saturation times for different respective temperatures.

5. The system of claim 4, further comprising an output node to receive the electrical current and provide the electrical current to a device under test (DUT).

6. The system of claim 5, wherein the DUT is a cryogenic DUT, and the electrical current is in one of a micro-amperes range or a nano-amperes range.

7. The system of claim 6, further comprising a current sensing circuit configured to sense the electrical current being provided by the current source circuit and provide the sensed electrical current to the controller.

8. The system of claim 7, wherein the controller is configured to:
determine a drift rate of the electrical current over time; and
compare the drift rate to a drift rate threshold or range to determine whether the drift rate is equal to or greater than the drift rate threshold or is outside the drift rate range.

9. The system of claim 8, wherein the controller is configured to compare the temperature to the temperature threshold in response to determining that the drift rate is equal to or greater than the drift rate threshold or is outside the drift rate range.

10. The system of claim 9, wherein the controller is configured to enter a stand-by mode for a period of time in response to determining that the drift rate is less than the drift rate threshold or is within the drift rate range.

11. A system comprising:
a controller comprising at least one processor and memory comprising machine readable instructions representative of a temperature compensation method, the at least one processor being configured to access the memory and execute the machine readable instructions to:
compare a temperature of an environment that includes a current source circuit or a temperature of the current source circuit to a temperature threshold;
identify a thermal saturation time for the current source circuit in response to determining that the temperature is greater than or equal to the temperature threshold;
generate a time constant adjustment signal responsive to identifying the thermal saturation time; and
provide the time constant adjustment signal to a temperature compensation circuit to adjust a time constant of the temperature compensation circuit to delay by a given amount of time that the temperature compensation circuit compensates for temperature effects on the current source circuit.

12. The system of claim 11, wherein the temperature compensation method is implemented during cryogenic electronic testing.

13. The system of claim 12, further comprising a current source circuit configured to generate an electrical current in one of a micro-amperes range or a nano-amperes range, and the temperature compensation circuit configured to provide a temperature compensation signal to the current source circuit to compensate for temperature effects on the electrical current responsive to the time constant adjustment signal.

14. The system of claim 13, further comprising an output node to provide a temperature compensated electrical current to a cryogenic device under test (DUT).

15. The system of claim 14, wherein the temperature compensation circuit comprises an adjustable resistor connected in parallel with a capacitor to form a resistor-capacitor (RC) network, the machine readable instructions causing the processor to compare the thermal saturation time to a time constant table characterizing thermal saturation times for different resistances to identify a respective resistance for the adjustable resistor.

16. The system of claim 14, wherein the machine readable instructions cause the processor to generate the time constant adjustment signal based on the identified resistance, wherein a resistance of the adjustable resistor is set responsive to the time constant adjustment signal to adjust the resistance of the adjustable resistor to the respective resistance to adjust the time constant of the temperature compensation circuit.

17. The system of claim 16, wherein the machine readable instructions cause the processor to compare the temperature to a temperature saturation table to identify the thermal saturation time in response to determining that the temperature is greater than or equal to the temperature threshold, wherein the temperature saturation table characterizes thermal saturation times for different respective temperatures.

18. A method comprising:
receiving a temperature signal characterizing a temperature of an environment that includes the current source circuit or a temperature of the current source circuit;
comparing the temperature to a temperature threshold;
identifying a thermal saturation time for the current source circuit from a temperature saturation table in response to the temperature being greater than or equal to the temperature threshold;
comparing the thermal saturation time to a time constant table characterizing thermal saturation times for different resistances to identify a respective resistance for an adjustable resistor of a resistor-capacitor (RC) network of a temperature compensation circuit;
generating a time constant adjustment signal based on the identified resistance; and
providing the time constant adjustment signal to the temperature compensation circuit to adjust a resistance of the adjustable resistor to adjust a time constant of the RC network of the temperature compensation circuit to delay by a given amount of time that the temperature compensation circuit compensates for temperature effects on a current source circuit.

19. The method of claim 18, further comprising:
generating via the current source circuit an electrical current in one of a micro-amperes range or a nano-amperes range; and
providing via the temperature compensation circuit a temperature compensation signal to the current source circuit to compensate for the temperature effects on the electrical current to provide a temperature compensated electrical current responsive to the time constant adjustment signal.

20. The method of claim 19, further comprising causing the temperature compensated electrical current to be provided to a cryogenic device under test (DUT) to verify a performance or characteristics of the cryogenic DUT.

\* \* \* \* \*